United States Patent [19]

Campbell

[11] 4,047,121

[45] Sept. 6, 1977

[54] RF SIGNAL GENERATOR

[75] Inventor: Kenneth J. Campbell, Solana Beach, Calif.

[73] Assignee: The United States of America as represented by the Secretary of the Navy, Washington, D.C.

[21] Appl. No.: 622,924

[22] Filed: Oct. 16, 1975

[51] Int. Cl.² .......................................... H04B 17/00
[52] U.S. Cl. ....................................... 331/76; 330/2; 324/77 B; 325/67; 325/363; 332/9 R
[58] Field of Search .................. 332/9, 44; 330/2; 331/53, 76; 324/77 B; 325/67, 363

[56] References Cited

U.S. PATENT DOCUMENTS

| | | | |
|---|---|---|---|
| 2,797,389 | 6/1957 | Hegarty | 332/9 R |
| 3,020,398 | 2/1962 | Hyde | 332/44 |
| 3,184,690 | 5/1965 | Garland | 332/44 |
| 3,199,047 | 8/1965 | Cushman | 331/76 |
| 3,223,928 | 12/1965 | Fayman | 331/53 |
| 3,311,812 | 3/1967 | Geiszler et al. | 331/76 |
| 3,478,280 | 11/1969 | Fenner | 332/9 R |
| 3,723,910 | 3/1973 | Cannon | 332/44 |
| 3,777,271 | 12/1973 | Telewski | 331/76 |
| 3,806,811 | 4/1974 | Thompson | 325/363 |

Primary Examiner—John Kominski
Attorney, Agent, or Firm—R. S. Sciascia; G. J. Rubens; T. M. Phillips

[57] ABSTRACT

An RF test signal generator including a driving oscillator, a pulse generator for generating narrow spikes at the oscillator frequency (such as a step recovery diode), a modulator and an attenuator. Since the very narrow pulse exhibits nearly constant amplitude in the frequency domain, a constant amplitude comb spectrum with frequency spacing at the oscillator frequency is generated so as to facilitate automated testing techniques.

5 Claims, 5 Drawing Figures

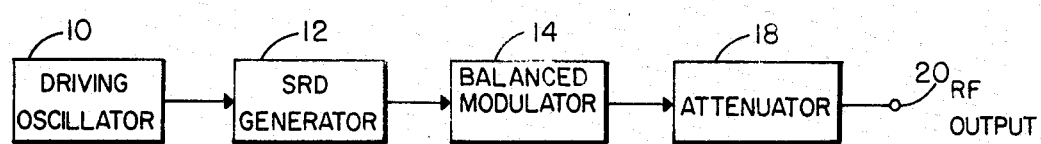
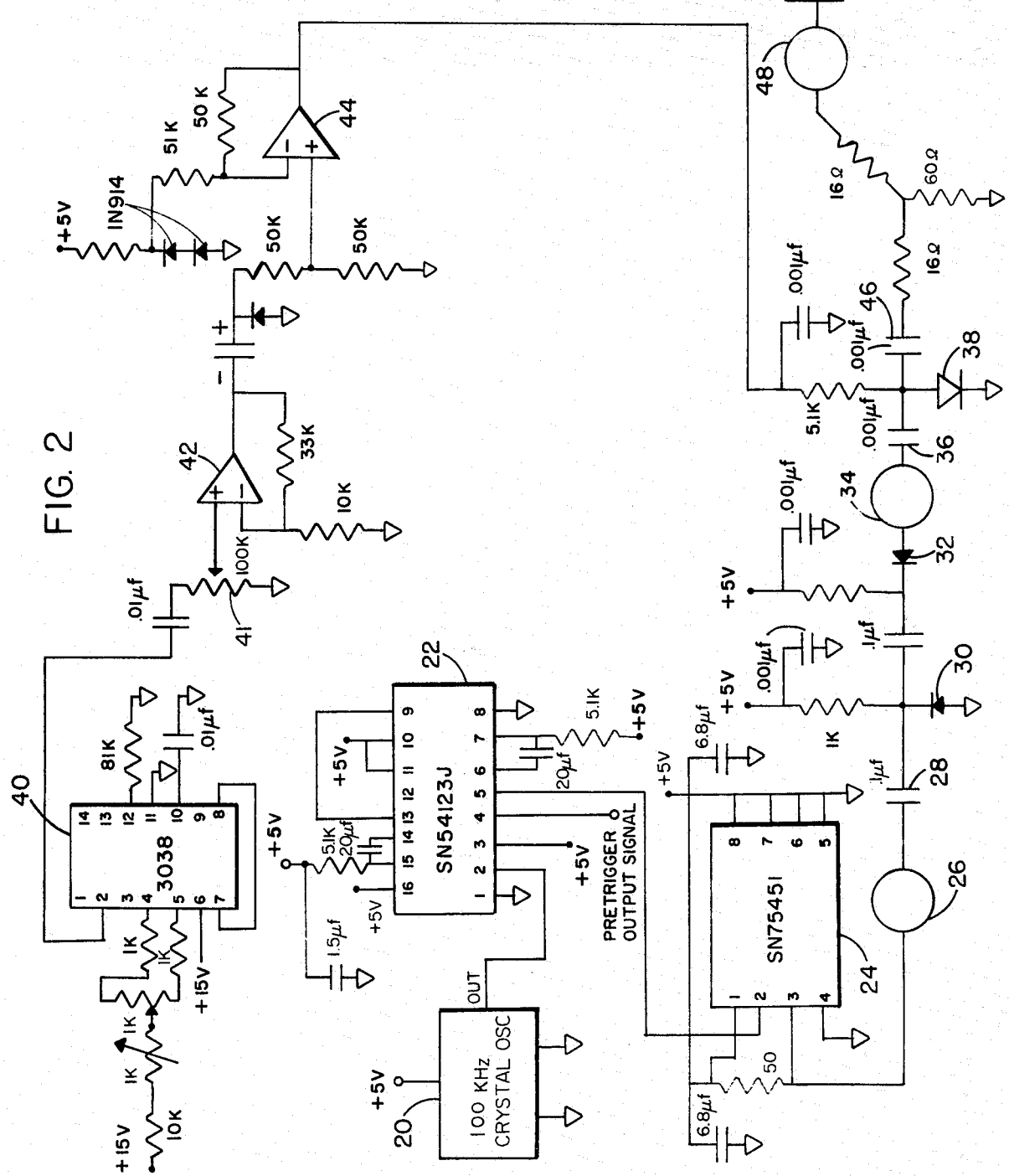

4,047,121

RF SIGNAL GENERATOR

BACKGROUND OF THE INVENTION

Present techniques of determining key parameters of amplitude modulated and single sideband receivers under test, i.e., receiver sensitivity bandpass characteristics and receiving frequency utilize a large signal generator used in conjunction with an oscilloscope and power meter. While such equipment is suitable for manual operation it is not adaptable to automated testing techniques. Signal generators which are adaptable to automated testing techniques, i.e., can be computer controlled are both complex and expensive. In many cases these equipments have capabilities which are far beyond automated testing requirements, resulting consequently, in the associated high cost of over design. Specifically these equipments typically will tune to within ten cycles of any desired frequency while in many cases it is sufficient to have limited frequency generating capabilities coupled with adaptability to computer control.

SUMMARY OF THE INVENTION

The present invention provides for a simple and reliable signal generator for generating an AM or DSB modulated radio frequency signal suitable for testing key parameters of a receiver under test. A constant frequency source operating at a frequency equal to the frequency spacing required between RF test signals drives a pulse generator for generating narrow spikes at the oscillator frequency. The very narrow pulses are of constant amplitude and at the predetermined frequency spacing are fed to a balanced modulator where they are amplitude modulated by means of a signal fed from a sine wave generator. Attenuator means are provided at the output of the balanced modulator for adjusting the radio frequency output level. A constant amplitude comb spectrum signal with frequency spacing at the fixed oscillator frequency is generated so as to facilitate automated testing techniques.

Accordingly, an object of the present invention is to provide an amplitude modulated RF signal generator.

Another object of the present invention is to provide a simple reliable signal generator for generating an AM or DSB modulated RF signal suitable for testing key parameters of a receiver under test.

Other ojbects and many of the attendant advantages of this invention will be readily appreciated as the same becomes better understood by reference to the following detailed description when considered in connection with the accompanying drawings.

BRIEF DESCRIPTION OF THE DRAWINGS

FIG. 1 is a block diagram of the preferred embodiment of the invention;

FIG. 2 is a schematic diagram of the embodiment of FIG. 1;

DESCRIPTION OF THE PREFERRED EMBODIMENTS

Figure 3:
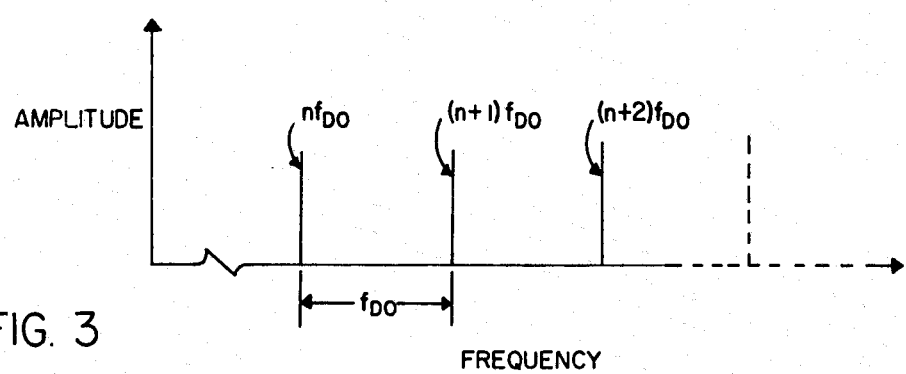
FIG. 3 is a spectrum analysis of a step recovery diode pulse generator.

Referring now to the drawing wherein there is shown in FIG. 1 a driving oscillator 10 which may, by way of example, be a CO-231 made by Vectron for providing a driving signal to step recovery diode generator 12 at a predetermined frequency of $F_{DO}$. The output pulses from pulse generator 12 are very narrow pulses of known amplitude at the frequency of the driving oscillator 10. The narrow pulses from generator 12 are fed to modulator 14. A source of modulator control signals is provided by an oscillator 16 for modulating the RF signal. The modulated signal from modulator 14 is fed to a variable attenuator 18 for controlling the level of the RF signal which appears at output terminal 20. Modulator 14 provides a proper form of required modulation. For amplitude operation, an amplitude modulator as shown in FIG. 2 would be used, for double sideband operation a balanced modulator may be used as shown in FIG. 1. The modulation signal is provided by the modulator-oscillator 16.

Figure 4:
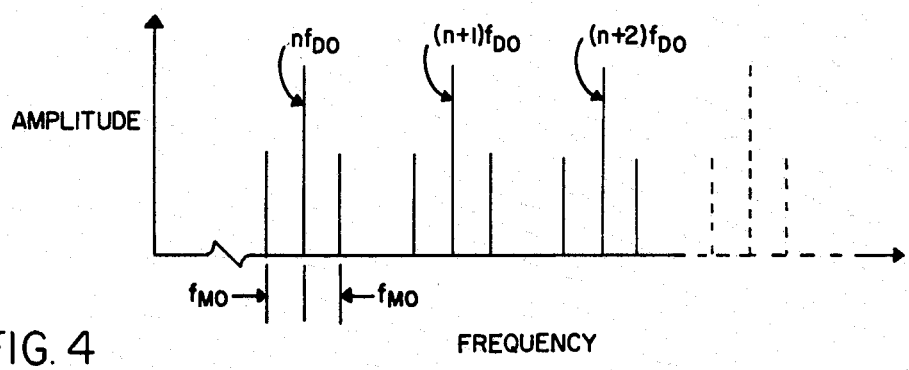
FIG. 4 is a spectrum analysis of the amplitude modulation signal.

In operation the driving oscillator 10 operates at a constant frequency, $F_{DO}$, equal to the frequency spacing required between RF signals. The output of oscillator 10 is coupled to the step recovery diode pulse generator 12, causing a very narrow or spike pulse each cycle. Since a very narrow pulse exhibits nearly constant amplitude in the frequency domain, a constant amplitude comb spectrum with frequency spacing $F_{DO}$ is generated (see FIG. 3). The comb spectrum output from SRD generator 12 is modulated in modulator 14 by the output from modulation oscillator 16 which operates at a frequency $F_{MO}$. FIG. 4 shows the resultant spectrum analysis with amplitude modulation. As can be seen, conventional amplitude modulated RF signals are generated every multiple of the driving oscillator 10 frequency, $F_{DO}$. Each of these signals has a modulation frequency equal to the modulation oscillator 16 frequency, $F_{MO}$. Modulation percentage may be controlled by varying the output amplitude of modulating oscillator 16.

Figure 5:
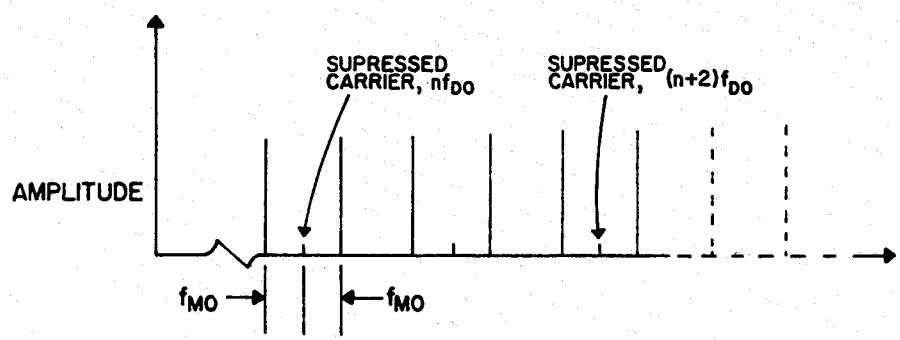
FIG. 5 is a spectrum analysis of a double sideband modulated signal.

FIG. 5 shows a double sideband modulation spectrum analysis. As can be seen, conventional DSB RF signals are generated every multiple of the driving oscillator 10 frequency $F_{DO}$. Each of these signals has a modulation frequency equal to the modulating oscillator 16 frequency $F_{MO}$. The output of modulator 14 is then fed through variable attenuator 18 in order to allow control of the RF signal output level.

Referring now to FIG. 2 wherein the invention is shown in schematic form, a 100 KHz crystal oscillator 20 provides an output signal to delay circuit 22 which provides a pre-trigger pulse to make the system compatible with measuring equipment that requires a pre-trigger pulse. The output pulses from delay circuit 22 are fed to a line driver 24. The ouptut from line driver 24 is fed through a 3db attenuator 26 to prevent reflections in the line and coupling capacitor 28 to the step recovery diode signal generator consisting of step recovery diodes 30 and 32. The spike signals or narrow pulses from step recovery diode 32 are fed through a 10db attenuator 34 to prevent signal reflections in the line through coupling capacitor 36 to modulating diode 38.

Also fed to modulating diode 38 is a 1 KHz sine wave signal with a variable DC offset. The modulating signal is provided by a 1 KHz oscillator 40, the output of which is fed through operational amplifiers 42 and 44 to provide the sine wave signal with DC offset. The variable input, by means of potentiometer 41, to operational amplifier 42 provides for modulation percent adjustments.

The modulated output signal from diode 38 is coupled through a coupling capacitor 46, 16db attenuator 48 and variable attenuator 50 to output terminal 52. The output signal at terminal 52 is the desired modulated RF signal which may be used for receiver testing and is compatible with a computerized system.

Obviously many modifications and variations of the present invention are possible in the light of the above teachings. It is therefore to be understood that within the scope of the appended claims the invention may be practiced otherwise than as specifically described.

What is claimed is:

1. In a signal generator for generating modulated RF signals available for testing key parameters of receivers the combination comprising:
  a. signal generating means for generating an output signal of a predetermined frequency;
  b. pulse generating means coupled to said signal generating means for generating spike output pulses at said predetermined frequency;
  c. balanced mixer modulator circuit means coupled to said pulse generator means;
  d. a source of amplitude modulating signal means coupled to said modulator circuit means for modulating said narrow pulses to provide a plurality of RF signals at the output of said modulator circuit means.

2. The signal generator of claim 1 wherein said pulsed generating means is a step recovery diode.

3. The signal generator of claim 1 wherein said signal generating means is a driving oscillator.

4. The signal generator of claim 3 wherein said pulse generating means is a step recovery diode pulsed generator coupled to said driving oscillator and being responsive to the output signal from said driving oscillator to generate very narrow pulses at the frequency of said driving oscillator.

5. The signal generator of claim 4 wherein said source of amplitude modulating signal means is a sine wave signal with a variable DC offset for adjusting the amount of carrier suppression.

* * * * *